United States Patent
Keshava et al.

(10) Patent No.: US 10,055,321 B2
(45) Date of Patent: Aug. 21, 2018

(54) STORAGE DEVICE, MAIN BOARD IN WHICH THE STORAGE DEVICE IS EMBEDDED, AND SELF-DIAGNOSIS METHOD THEREOF

(71) Applicant: SAMSUNG ELECTRONICS CO., LTD., Suwon-si, Gyeonggi-Do (KR)

(72) Inventors: Sunil Keshava, Suwon-si (KR); Donggun Kim, Hwaseong-si (KR); Vijay Motagi, Suwon-si (KR); Kihyun Choi, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 177 days.

(21) Appl. No.: 15/059,094

(22) Filed: Mar. 2, 2016

(65) Prior Publication Data
US 2016/0358669 A1 Dec. 8, 2016

(30) Foreign Application Priority Data
Jun. 4, 2015 (KR) .................. 10-2015-0079331

(51) Int. Cl.
| | |
|---|---|
| *G06F 11/273* | (2006.01) |
| *G11C 29/38* | (2006.01) |
| *G11C 29/36* | (2006.01) |
| *G06F 11/263* | (2006.01) |
| *G11C 29/42* | (2006.01) |
| *G11C 16/00* | (2006.01) |

(52) U.S. Cl.
CPC ........ *G06F 11/2733* (2013.01); *G06F 11/263* (2013.01); *G11C 29/36* (2013.01); *G11C 29/38* (2013.01); *G11C 29/42* (2013.01); *G11C 16/00* (2013.01)

(58) Field of Classification Search
CPC ...... G06F 11/263; G06F 11/27; G06F 11/273; G06F 11/2733; G11C 29/38; G11C 29/42
See application file for complete search history.

(56) References Cited

U.S. PATENT DOCUMENTS

| | | | |
|---|---|---|---|
| 6,694,360 B1 * | 2/2004 | Duguay ................. | H04L 69/22 709/220 |
| 6,895,500 B1 * | 5/2005 | Rothberg ............... | G11B 27/36 360/31 |
| 7,325,095 B2 * | 1/2008 | Williams .............. | G06F 3/0613 711/100 |
| 7,679,133 B2 | 3/2010 | Son et al. | |

(Continued)

FOREIGN PATENT DOCUMENTS

| | | |
|---|---|---|
| KR | 100224966 | 7/1999 |
| KR | 1020000038659 | 7/2000 |

(Continued)

*Primary Examiner* — Joseph R Kudirka
(74) *Attorney, Agent, or Firm* — F. Chau & Associates, LLC

(57) ABSTRACT

A storage device includes at least one nonvolatile memory device, a host interface configured to communicate with a peripheral channel hub disposed external to the storage device, a sideband interface configured to receive a self-diagnostic command from a host disposed external to the storage device, and a self-diagnostic firmware configured to be driven in response to the self-diagnostic command to perform a self-diagnosis operation on the storage device.

19 Claims, 11 Drawing Sheets

(56) References Cited

U.S. PATENT DOCUMENTS

| | | | |
|---|---|---|---|
| 7,962,792 B2* | 6/2011 | Diggs | G06F 3/0616 |
| | | | 714/27 |
| 7,992,042 B2 | 8/2011 | Todoroki et al. | |
| 8,010,843 B2 | 8/2011 | Righi et al. | |
| 8,553,466 B2 | 10/2013 | Han et al. | |
| 8,559,235 B2 | 10/2013 | Yoon et al. | |
| 8,654,587 B2 | 2/2014 | Yoon et al. | |
| 9,645,954 B2* | 5/2017 | Pamley | G06F 13/1684 |
| 2002/0133794 A1* | 9/2002 | Kanapathippillai | G01R 31/31705 |
| | | | 716/136 |
| 2006/0200605 A1 | 9/2006 | Hatamori | |
| 2008/0077822 A1* | 3/2008 | Hara | G06F 11/008 |
| | | | 714/25 |
| 2011/0233648 A1 | 9/2011 | Seol et al. | |
| 2011/0252277 A1 | 10/2011 | Peng | |
| 2013/0198574 A1* | 8/2013 | Higley | G06F 11/0727 |
| | | | 714/45 |
| 2014/0019646 A1* | 1/2014 | Cadigan | G06F 1/185 |
| | | | 710/5 |
| 2014/0149617 A1 | 5/2014 | Chiang et al. | |
| 2014/0281133 A1* | 9/2014 | Karamcheti | G06F 3/061 |
| | | | 711/103 |
| 2016/0358668 A1* | 12/2016 | Hong | G06F 13/1673 |
| 2017/0010995 A1* | 1/2017 | Robinson | G06F 13/4022 |

FOREIGN PATENT DOCUMENTS

| | | |
|---|---|---|
| KR | 1020050107159 | 11/2005 |
| KR | 1020120064518 | 6/2012 |
| KR | 1020140060745 | 5/2014 |

* cited by examiner

FIG. 5

| Num. | SDIAG Command | Description |
|---|---|---|
| 1 | I2C Reset | Reset the device I2C module |
| 2 | Open SDIAG Session | Open SDIAG Session |
| 3 | Switch Device Mode | Switch between normal and diagnostic modes of operation |
| 4 | BIST | Run device "Built In Self-Test" |
| 5 | Extract Dump | Extract debugging information from device |
| 6 | Check Progress | Check progress of command |
| 7 | Close SDIAG Session | Close SDIAG Session |

STORAGE DEVICE, MAIN BOARD IN WHICH THE STORAGE DEVICE IS EMBEDDED, AND SELF-DIAGNOSIS METHOD THEREOF

CROSS-REFERENCE TO RELATED APPLICATIONS

This application claims priority under 35 U.S.C. § 119 to Korean Patent Application No. 10-2015-0079331, filed on Jun. 4, 2015, the disclosure of which is hereby incorporated by reference in its entirety.

TECHNICAL FIELD

Exemplary embodiments of the inventive concept relate to a storage device, a main board in which the storage device is embedded, and a self-diagnosis method thereof.

DISCUSSION OF THE RELATED ART

A self-contained completed solid state device (SSD) may be tested for errors via a standardized communication terminal used for testing purposes such as, for example, a joint test action group (JTAG) terminal, disposed thereon. However, due to security concerns and in effort to reduce the size of semiconductor devices, semiconductor packages including an SSD that do not include a communication terminal used for testing, and that are directly mounted onto a main board, are available. Such on-board SSD devices cannot be tested using approaches that rely on utilizing a communication terminal typically used to test an SSD for errors.

SUMMARY

Exemplary embodiments of the inventive concept provide a storage device having at least one nonvolatile memory device and a memory controller configured to control the at least one nonvolatile memory device. The memory controller includes a host interface configured to communicate with an external peripheral channel hub, and a sideband interface configured to receive a self-diagnostic command from an external host to drive a self-diagnostic firmware. The self-diagnostic firmware may be included in the memory controller, and may be configured to be driven in response to the self-diagnostic command to perform a self-diagnosis operation on the storage device.

In exemplary embodiments of the inventive concept, the host interface is a serial AT attachment bus express (SATAe) interface or a peripheral component interconnect express (PCIe) interface, and the sideband interface is an inter-integrated circuit (I2C) interface.

In exemplary embodiments of the inventive concept, the self-diagnostic firmware includes a first mode supporting a start command for waking up the storage device. The storage device is configured to accommodate commands needed in the self-diagnostic firmware in response to the start command.

In exemplary embodiments of the inventive concept, the self-diagnostic firmware includes a second mode in which the storage device is in a maximum power state and in which a self-diagnostic session is closed.

In exemplary embodiments of the inventive concept, the self-diagnostic firmware includes a third mode in which a self-diagnostic session is authenticated and in an open state.

In exemplary embodiments of the inventive concept, the self-diagnostic command is inputted from the host according to a write request of the sideband interface, and the storage device sends an acknowledge signal to the host in response to the write request.

In exemplary embodiments of the inventive concept, after a predetermined time passes after the self-diagnostic command is received, a fetch command that instructs a self-diagnostic result value to be output is received.

In exemplary embodiments of the inventive concept, when performing a self-diagnosis in response to the self-diagnostic command, a response signal including a busy retry is sent to the host in response to the fetch command.

In exemplary embodiments of the inventive concept, after a self-diagnosis is completed in response to the self-diagnostic command, a response signal including a command completion indication is sent to the host in response to the fetch command.

In exemplary embodiments of the inventive concept, in the case that an error occurs as a result of performing a self-diagnosis operation in response to the self-diagnostic command, an error internally generated by the storage device is corrected by a predetermined process.

In exemplary embodiments of the inventive concept, the storage device is a PCIe SSD, and a universal serial bus (USB) port which is connected to the host provides the sideband interface.

In exemplary embodiments of the inventive concept, the sideband interface issues a write request, the self-diagnostic command is received from the host according to the write request, and the storage device sends an acknowledge signal to the host in response to the write request.

In exemplary embodiments of the inventive concept, the storage devices receives a fetch command that instructs a self-diagnostic result value to be output after a predetermined time passes after the self-diagnostic command is received.

In exemplary embodiments of the inventive concept, a response signal including a busy retry packet is sent by the storage device to the host in response to the fetch command when performing the self-diagnosis operation.

In exemplary embodiments of the inventive concept, a response signal indicating that the self-diagnosis operation is completed is sent by the storage device to the host in response to the fetch command after the self-diagnosis operation is completed.

In exemplary embodiments of the inventive concept, an error internally generated by the storage device when performing the self-diagnosis operation is corrected by a predetermined process.

In exemplary embodiments of the inventive concept, the storage device is a peripheral component interconnect express (PCIe) solid state drive (SSD) further including a universal serial bus (USB) port connected to the host, in which the sideband interface is provided via the USB port.

Exemplary embodiments of the inventive concept also provide a self-diagnostic method of a storage device. The self-diagnostic method of a storage device includes receiving a self-diagnostic command through a sideband interface, driving a self-diagnostic firmware in response to the self-diagnostic command, receiving a fetch command with respect to a driving result value of the self-diagnostic firmware through the sideband interface, and outputting the driving result value to a debugger through the sideband interface in response to the fetch command.

In exemplary embodiments of the inventive concept, when an error occurs in a self-diagnosis according to the self-diagnostic command, a response signal including a busy retry is output to the debugger, and an operation for resolving the error autonomously is performed.

In exemplary embodiments of the inventive concept, before receiving the self-diagnostic command, a reset command for resetting the sideband interface of the storage device is received.

Exemplary embodiments of the inventive concept also provide a main board. The main board includes a peripheral channel hub for connecting a chip set and internal devices, an SSD performing communication through the peripheral channel hub and a first interface, and a multiplexer connected to the peripheral channel hub and the SSD through a second interface. The SSD receives an external self-diagnostic command via the multiplexer through the second interface and drives a self-diagnostic firmware in response to the self-diagnostic command. The peripheral channel hub, the SSD and the multiplexer are mounted on a printed circuit board.

Exemplary embodiments of the inventive concept also provide a main board. The main board includes a storage device including at least one nonvolatile memory device, a peripheral channel hub configured to facilitate communication between a plurality of components disposed on the main board, in which the peripheral channel hub is disposed external to the storage device, a host interface disposed in the storage device and configured to communicate with the peripheral channel hub, a sideband interface disposed in the storage device and configured to receive a self-diagnostic command from a host disposed external to the main board, and a self-diagnostic firmware disposed in the storage device and configured to be driven in response to the self-diagnostic command to perform a self-diagnosis operation on the storage device.

BRIEF DESCRIPTION OF THE DRAWINGS

The above and other features of the present inventive concept will become more apparent by describing in detail exemplary embodiments thereof with reference to the accompanying drawings in which:

FIG. 5 is a drawing illustrating a self-diagnostic command according to exemplary embodiments of the inventive concept.

DETAILED DESCRIPTION

Figure 1:
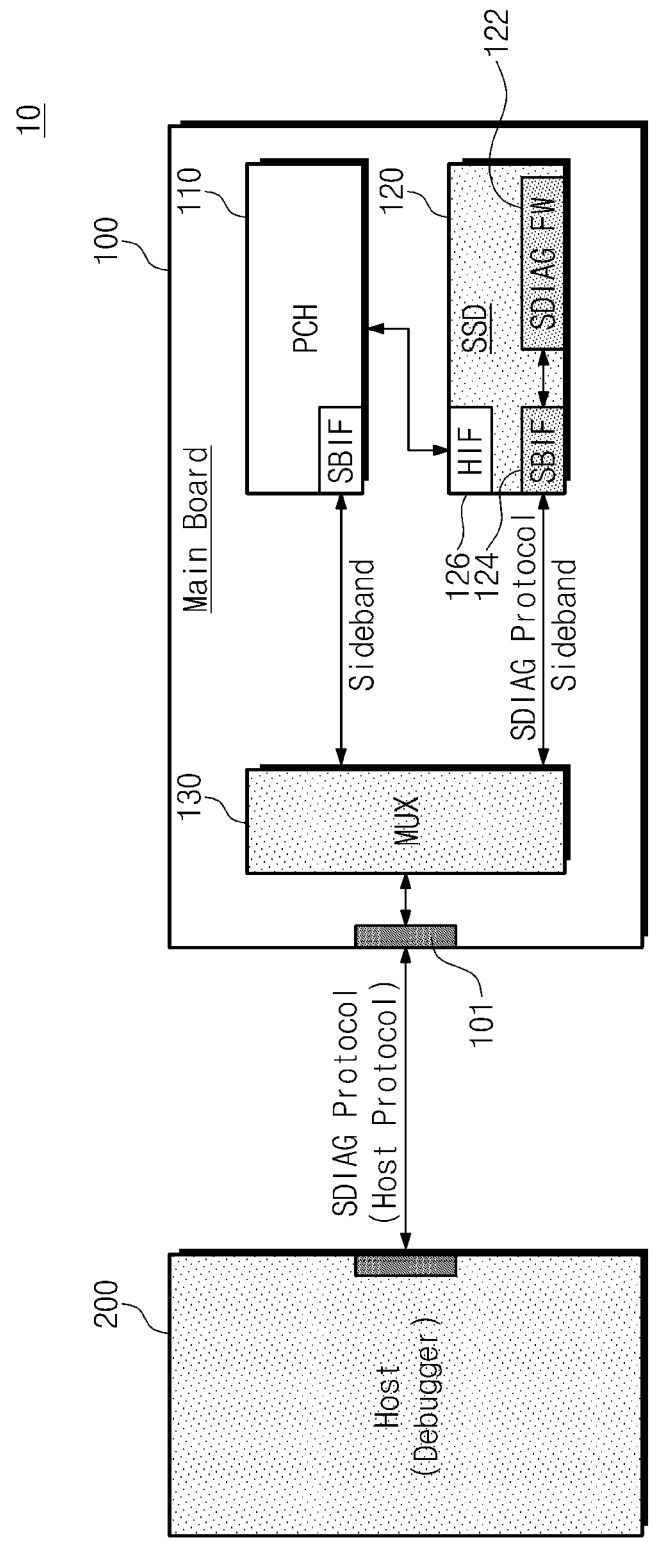
FIG. 1 is a drawing illustrating a test system for describing exemplary embodiments of the inventive concept.

Exemplary embodiments of the inventive concept will be described more fully hereinafter with reference to the accompanying drawings. In the drawings, the size and relative sizes of layers and regions may be exaggerated for clarity. Like reference numerals may refer to like elements throughout the accompanying drawings.

It will be understood that, although the terms "first," "second," etc. may be used herein to describe various elements, these elements should not be limited by these terms. Thus, a "first" element in an exemplary embodiment may be described as a "second" element in another exemplary embodiment.

It will be understood that when an element is referred to as being "connected" or "coupled" to another element, it can be directly connected or coupled to the other element or intervening elements may be present.

As used herein, the singular forms "a", "an" and "the" are intended to include the plural forms as well, unless the context clearly indicates otherwise.

FIG. 1 is a drawing illustrating a test system for describing exemplary embodiments of the inventive concept. Referring to FIG. 1, a test system 10 includes a main board 100 and a host 200 testing the main board 100. As shown in FIG. 1, the host 200 is disposed external to the main board 100.

The main board 100 may include a peripheral channel hub (PCH) 110, a solid state drive (SSD) 120, and a multiplexer 130. The peripheral channel hub (PCH) 110 may connect a central processing unit (CPU), a random access memory (RAM), a chipset, and various types of devices disposed on the main board 100 to a predetermined interface, allowing the various different devices disposed on the main board 100 to communicate with one another. That is, the peripheral channel hub (PCH) may facilitate communication between the various different devices/components disposed on the main board 100. The SSD 120 may be embedded in the main board 100. When embedded in the main board 100, the SSD 120 may be referred to as an on-board SSD. The SSD 120 may be, for example, a peripheral component interconnect express solid state drive (PCIe SSD).

The SSD 120 may include, for example, a self-diagnostic firmware (SDIAG FW) 122, a sideband interface (also referred to herein as a second interface) 124 and a host interface (also referred to herein as a first interface) 126. As shown in FIG. 1, the peripheral channel hub (PCH) 110 is disposed on the main board 100 and is disposed external to the SSD 120 (and thus, external to the host interface 126).

The self-diagnostic firmware (SDIAG FW) 122 may receive a self-diagnostic command from the host 200, and may perform a self-diagnosis operation on the SSD 120 in response to receiving the self-diagnostic command. For example, according to exemplary embodiments of the present inventive concept, the SSD 120 is a device in a package form that is directly mounted on the main board 100 (e.g., a motherboard of a device such as, for example, a mobile phone, tablet computer, laptop computer, etc.), and that does not include a standard communication terminal used for testing purposes (e.g., a joint test action group (JTAG) terminal). Since the SSD 120 is not a self-contained completed device capable of being tested prior to being mounted on the main board 100 via a standard communication terminal, the SSD 120 provides the capability of performing a self-diagnosis operation on itself via the self-diagnostic firmware 122, as described herein. In exemplary embodiments, the self-diagnostic firmware 122 may be stored in at least one nonvolatile memory device inside the SSD 120.

The sideband interface 124 is connected to the multiplexer 130 through a sideband channel and receives a self-diagnostic command and/or a self-diagnostic result request from the external host 200. A self-diagnostic request operation and/or a test operation result request operation may be performed by a self-diagnostic protocol (SDIAG protocol) according to exemplary embodiments of the inventive concept. The sideband interface 124 may be an inter-integrated circuit (I2C) interface. However, the sideband interface 124 is not limited thereto.

The host interface 126 is an interface for communicating with the peripheral channel hub (PCH) 110. The host interface 126 may be implemented using, for example, at least one of various interfaces such as a serial advanced technology attachment (SATA) interface, a SATA express (SATAe) interface, a universal serial bus (USB) interface, a peripheral component interconnection (PCI) interface, a PCI express (PCIe) interface, a secure digital (SD) interface, a small computer system interface (SCSI), a serial attached SCSI (SAS) interface, a universal flash storage (UFS) interface, a NAND interface, a fiber channel (FC) interface, etc. In an exemplary embodiment, the host interface 126 is an interface different from the sideband interface 124.

The multiplexer 130 may be connected to the peripheral channel hub (PCH) 110 and the SSD 120 through a sideband channel. The multiplexer 130 may be connected to the host 200 through a physical port 101. In an exemplary embodiment, the physical port 101 may be a port that is used only for a sideband protocol. In an exemplary embodiment, the physical port 101 may be a port used for both a sideband protocol and a USB protocol. For example, in an exemplary embodiment, the physical port 101 is a USB protocol port that supports an I2C protocol.

The host (e.g., a debugger) 200 may request a test with respect to the SSD 120 embedded in the main board 100. In response to a test request, the SSD 120 performs a predetermined test operation by driving the self-diagnostic firmware 122. That is, the self-diagnostic firmware 122 is driven in response to a self-diagnostic command to perform a self-diagnosis operation on the main board 100 (e.g., the storage device). Subsequently, the host 200 may request a test result value using a sideband protocol, and in response to the request, the SSD 120 may send a self-diagnostic result value to the host 200.

According to exemplary embodiments, the test system 10 may include the main board 100 in which the SSD 120 is embedded, and which is capable of performing a self-diagnosis operation according to a test request of the host 200. Thus, according to exemplary embodiments of the inventive concept, reliability regarding an SSD package may be improved by allowing a test operation to be performed on the SSD 120.

For convenience of description, herein, the sideband interface 124 is described as being an I2C interface. The I2C interface is constituted by bidirectional open drain lines and a serial data line (SDA), and operates in a master-slave form. However, exemplary embodiments are not limited thereto.

Figure 2:
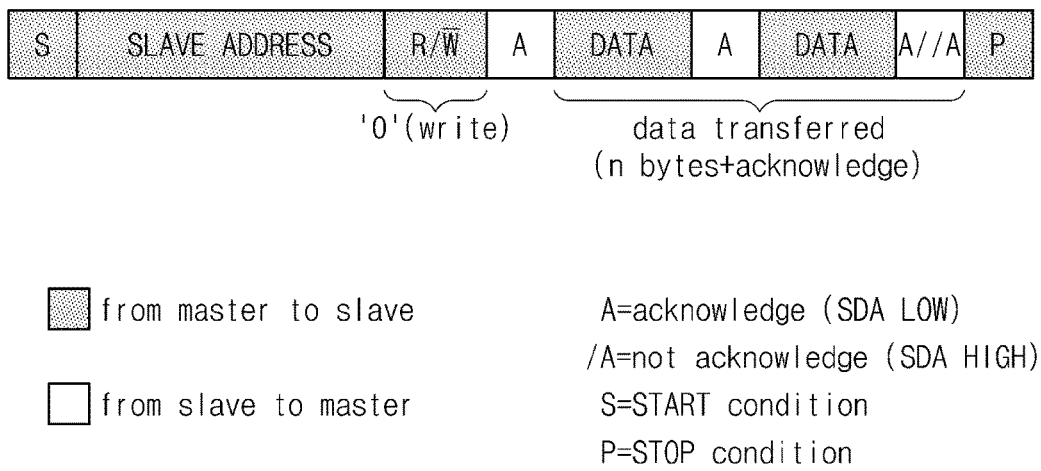
FIG. 2 is a drawing illustrating a write operation in a sideband interface according to exemplary embodiments of the inventive concept.

FIG. 2 is a drawing illustrating a write operation in a sideband interface according to exemplary embodiments of the inventive concept. Referring to FIG. 2, a master (e.g., host 200) sends a beginning condition (S), a slave address, and a write command. In response, the slave (e.g., SSD 120) outputs an acknowledge signal (A) of a row form and then the master sends data to be written. The slave outputs an acknowledge signal (A) and then the master sends data to be written. In the case of the last data, the slave outputs an unacknowledged signal (/A). After that, the master sends a stop condition (P). A write command may be directed as '0'. However, according to exemplary embodiments, the write command is not limited thereto.

Figure 3:
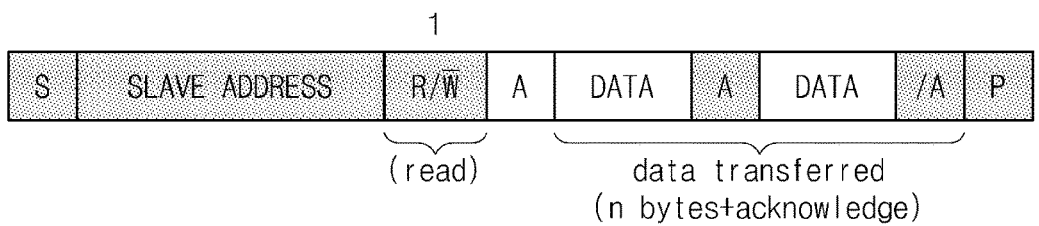
FIG. 3 is a drawing illustrating a read operation in a sideband interface according to exemplary embodiments of the inventive concept.

FIG. 3 is a drawing illustrating a read operation in a sideband interface according to exemplary embodiments of the inventive concept. Referring to FIG. 3, a master (e.g., host 200) sends a beginning condition (S), a slave address, and a read command. In response, the slave (e.g., SSD 120) sends an acknowledge signal (A) of a row form and data to be sent. Subsequently, the master receives data and sends the acknowledge signal (A). These operations are repeated, and after the last data is sent, the master sends an unacknowledged signal (/A) and a stop condition (P) to the slave. A read command may be directed as '1'. However, according to exemplary embodiments, the read command is not limited thereto.

Figure 4:
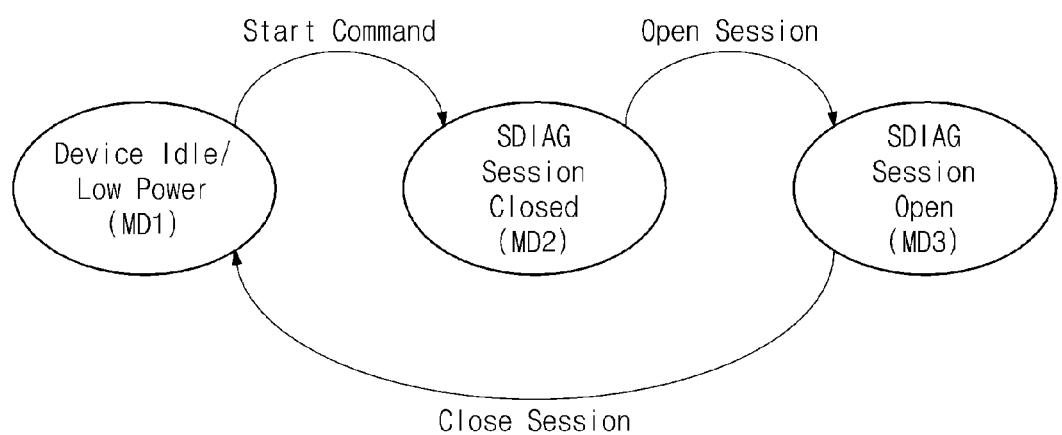
FIG. 4 is a drawing illustrating a self-diagnostic mode of a solid state drive (SSD) according to exemplary embodiments of the inventive concept.

FIG. 4 is a drawing illustrating a self-diagnostic mode of an SSD according to exemplary embodiments of the inventive concept. Referring to FIG. 4, a self-diagnostic mode of the SSD 120 may be classified into three modes. The first mode is a device idle state/low power mode (MD1), the second mode is a self-diagnostic session closed mode (MD2) and the third mode is a self-diagnostic session open mode (MD3).

In the device idle state/low power mode (MD1), after the SSD 120 is booted up, the SSD 120 generally transitions to a low power mode. In a low power state, a self-diagnostic firmware provides a start command to wake up the SSD 120. In response to the start command, the SSD 120 can prepare to accommodate (e.g., receive and execute) all self-diagnostic commands.

In the self-diagnostic session closed mode (MD2), the SSD 120 is in a maximum power state. However, a command can be provided only after a session is open. An "open SDIAG session" command may be used to authenticate a self-diagnostic session.

In the self-diagnostic session open mode (MD3), all functions of a self-diagnosis are supported.

FIG. 5 is a drawing illustrating a self-diagnostic command according to exemplary embodiments of the inventive concept.

Referring to FIG. 5, the self-diagnostic command may include a plurality of commands. For example, the self-diagnostic command may include an I2C reset command for resetting a device I2C module. The self-diagnostic command may further include an open SDIAG session for opening a self-diagnostic session. The self-diagnostic command may further include a switch device mode command for directing a switch between a normal state and a diagnostic mode state. The self-diagnostic command may further include a BIST command for executing a "built in self test". The self-diagnostic command may further include an extract dump command for extracting debugging information from the SSD 120. The self-diagnostic command may further include a check progress command for checking progress of a command. The self-diagnostic command may further include a close SDIAG session command for closing a self-diagnostic session. It is to be understood that the self-diagnostic commands illustrated in FIG. 5 are illustrative, and that according to exemplary embodiments, commands may be added to or removed from the list.

Figure 6:
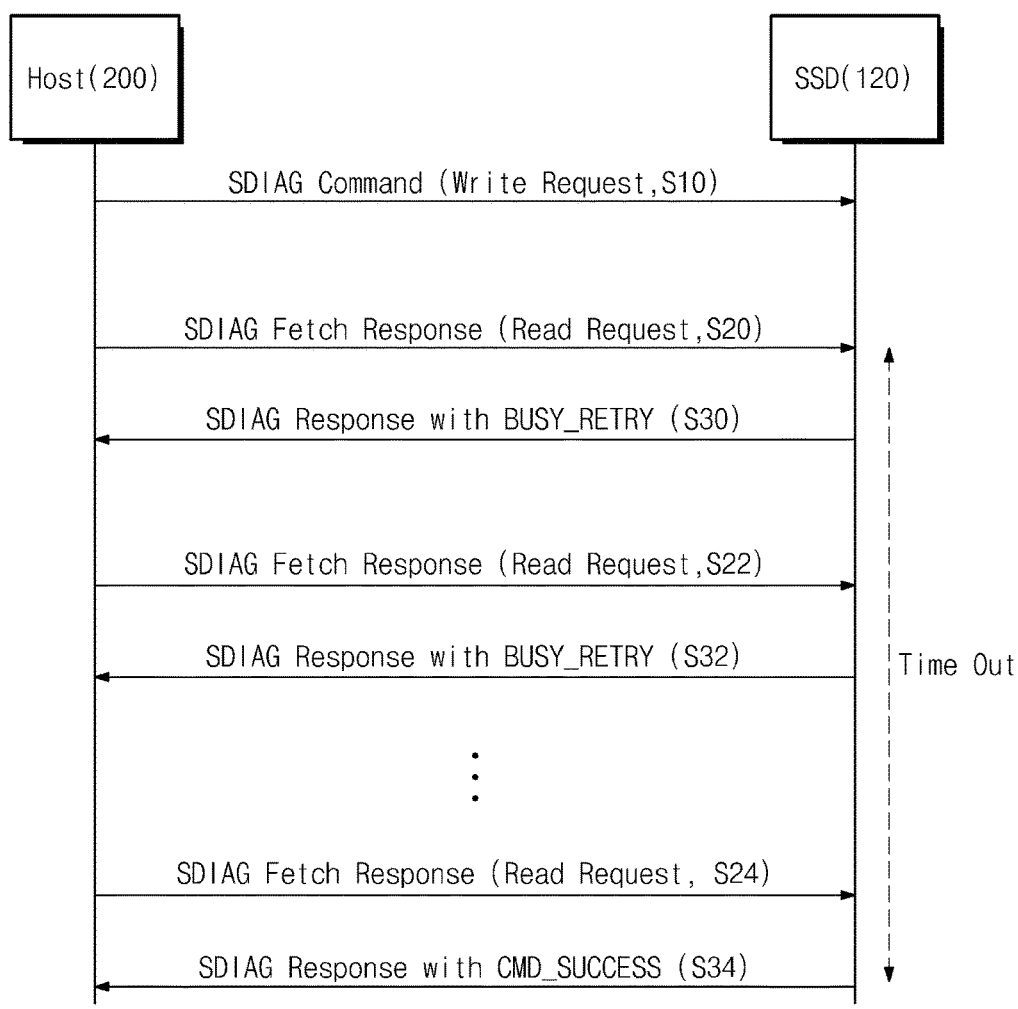
FIG. 6 is a ladder diagram illustrating a self-diagnostic process of an SSD according to exemplary embodiments of the inventive concept.

FIG. 6 is a ladder diagram illustrating a self-diagnostic process of an SSD according to exemplary embodiments of the inventive concept. Referring to FIGS. 1 through 6, according to an exemplary embodiment of the inventive concept, a self-diagnostic process is implemented as follows.

The host 200 sends a self-diagnostic command to the SSD 120. The self-diagnostic command may be sent by, for example, a write request of an I2C interface (S10). The host 200 may wait for a predetermined time before a read request of a device is sent. The self-diagnostic firmware 122 of the SSD 120 processes a self-diagnostic command and checks for an error. If an error occurs in the self-diagnostic command, the self-diagnostic firmware 122 may prepare a suitable error response. If an error does not exist in the self-diagnostic command, the self-diagnostic firmware 122 proceeds in a busy state (BUSY-RETRY) (S30) and starts an operation requested by the self-diagnostic command.

Subsequently, the host 200 may send a read request to the SSD 120 to fetch a response of the self-diagnostic firmware 122 of the SSD 120 after a predetermined time passes after outputting a self-diagnostic command (S20) (e.g., via a fetch command). If an error exists in the last command, the self-diagnostic firmware 122 may respond with a suitable error packet. If an error does not exist, the self-diagnostic firmware 122 may send a response indicating that the requested self-diagnosis operation is completed (CMD_SUCCESS) (S34). When an error occurs in a self-diagnostic operation, the self-diagnostic firmware 122 may additionally perform an operation for correcting the error that occurred according to a predetermined process.

If a requested operation is not completed, the self-diagnostic firmware 122 sends a response having a "BUSY_RETRY" packet (S30). After a predetermined time passes, a read request and a response with respect to the response fetch may be repeated (S22, S32, . . . , S24). A size of the response packet may be embodied by a structure defined by a self-diagnostic protocol.

Figure 7:
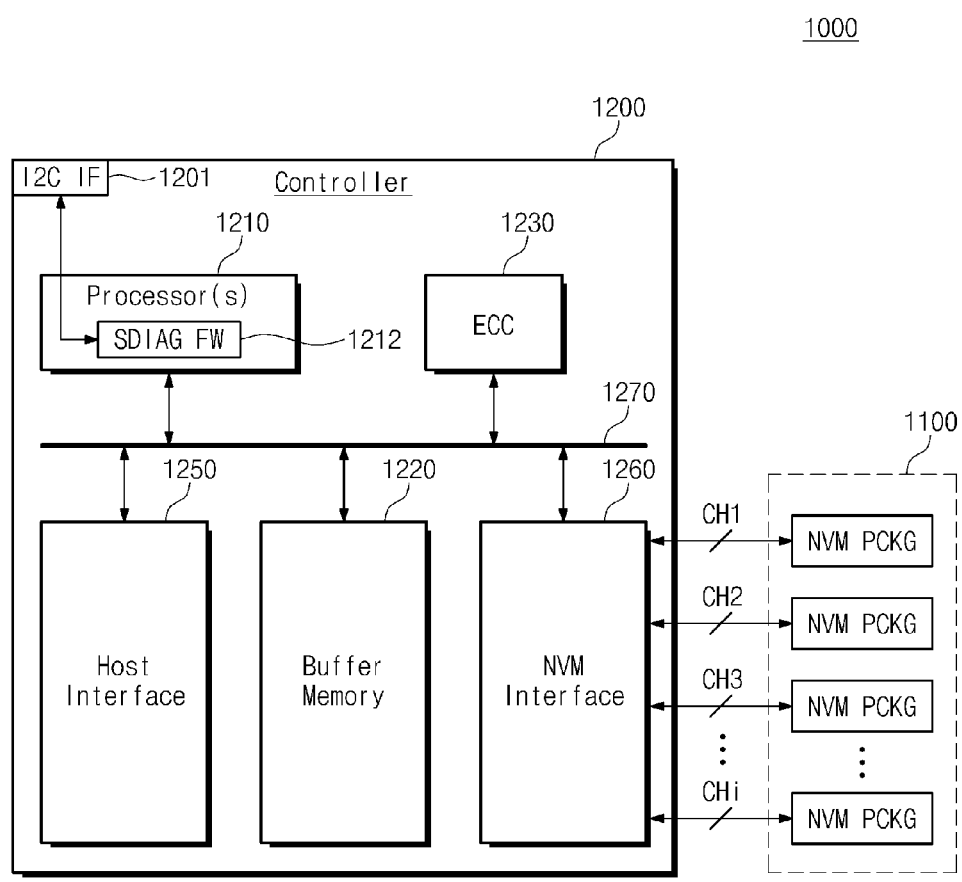
FIG. 7 is a block diagram illustrating an SSD according to exemplary embodiments of the inventive concept.

FIG. 7 is a block diagram illustrating an SSD according to exemplary embodiments of the inventive concept. Referring to FIG. 7, an SSD 1000 includes a nonvolatile memory device 1100 and a memory controller 1200.

The nonvolatile memory device 1100 may be configured to optionally receive an external high voltage Vpp. The nonvolatile memory device 1100 may include a plurality of nonvolatile memory packages NVM PCKG connected to a plurality of channels (CH1~Chi, in which i is an integer greater than or equal to 2). The nonvolatile memory device 1100 may be, for example, a NAND flash memory, a vertical NAND flash memory (VNAND), a NOR flash memory, a resistive random access memory (RRAM), a phase-change random access memory (PRAM), a magneto resistive random access memory (MRAM), a ferroelectric random access memory (FRAM), a spin transfer torque random access memory (STT-RAM), etc. The nonvolatile memory device 1100 may be embodied, for example, by a three-dimensional (3D) array structure. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In an exemplary embodiment of the present inventive concept, the 3D memory array includes vertical NAND strings that are vertically oriented such that at least one memory cell is located over another memory cell. The at least one memory cell may include a charge trap layer. Each vertical NAND string may include at least one select transistor located over memory cells, the at least one select transistor having the same structure with the memory cells and being formed monolithically together with the memory cells.

The following patent documents, which are hereby incorporated by reference, describe suitable configurations for three-dimensional memory arrays, in which the three-dimensional memory array is configured as a plurality of levels, which word lines and/or bit lines shared between levels: U.S. Pat. Nos. 7,679,133; 8,553,466; 8,654,587; 8,559,235; and US Pat. Pub. No. 2011/0233648.

A nonvolatile memory device NVM according to an exemplary embodiment of the inventive concept is applicable to not only a flash memory device in which a charge storage layer is constituted by a conductive floating gate, but also to a charge trap flash (CTF) in which a charge storage layer is constituted by an insulating layer.

The memory controller 1200 is connected to the nonvolatile memory device 1100 through the channels CH1~Chi. As described above with reference to FIGS. 1 through 6, the memory controller 1200 may include a self-diagnostic firmware that performs a self-diagnosis using an external host.

The memory controller 1200 includes an I2C interface 1201, at least one processor 1210, a buffer memory 1220, an error correction circuit 1230, a host interface 1250 and a nonvolatile memory interface 1260. The at least one processor 1210, the buffer memory 1220, the error correction circuit 1230, the host interface 1250 and the nonvolatile memory interface 1260 may be connected one another via a bus 1270.

The I2C interface 1201 is a serial interface for performing a self-diagnostic protocol through an external debugger. A self-diagnostic firmware 1212 may be driven by self-diagnostic commands inputted into the I2C interface 1201.

The buffer memory 1220 may temporarily store data needed by an operation of the memory controller 1200. The buffer memory 1220 may include a plurality of memory lines storing data or commands. The memory lines may be mapped to cache lines in various ways. In FIG. 7, the buffer memory 1220 is disposed inside the memory controller 1200, however, exemplary embodiments of the inventive concept are not limited thereto. For example, according to exemplary embodiments, the buffer memory 1220 may be disposed outside the memory controller 1200 as a separate intellectual property (IP) block.

The error correction circuit 1230 may calculate an error correction code value of data to be programmed in a write operation, correct an error of data read in a read operation based on the error correction code value, and correct an error of data restored from the nonvolatile memory device 1100 in a data restoration operation.

The error correction circuit 1230 generates a fail bit of data received from the nonvolatile memory device 1100 or an error correction code (ECC) for correcting an error bit. The error correction circuit 1230 performs an error correction encoding of data being provided from the nonvolatile memory device 1230 to form data to which a parity bit is added. The parity bit may be stored in the nonvolatile memory device 1230. The error correction circuit 1230 may perform error correction decoding on data output from the nonvolatile memory device 1100. The error correction circuit 1230 may correct an error using a coded modulation such as, for example, a low density parity check (LDPC), a BCH code, a turbo code, a Reed-Solomon code, a convolution code, a recursive systematic code (RSC), a trellis-coded modulation (TCM), a block coded modulation (BCM), etc.

In an exemplary embodiment, a code memory storing code data needed when operating the memory controller 1200 may be further included. The code memory may be embodied, for example, as a nonvolatile memory device.

The host interface 1250 can provide an interface function with an external device. The host interface 1250 may be connected to a host through, for example, a SATA interface, a SATAe interface, a SCSI, a USB interface, a PCI interface, a PCIe interface, an SD interface, a SAS interface, a UFS interface, a NAND interface, an FC interface, etc.

The nonvolatile memory interface 1260 may provide an interface function with the nonvolatile memory device 1100.

In an exemplary embodiment, the memory controller 1200 may include a wireless transceiver to provide wireless (e.g., WiFi) functionality.

According to exemplary embodiments of the inventive concept, the SSD 1000 may improve reliability of a package by performing self-diagnosis in response to receiving an external request, even after the SSD is already packaged on a board (e.g., a printed circuit board (PCB)).

Referring to FIGS. 1 through 7, the device embedded in the main board 100 was described as being an SSD 120. However, exemplary embodiments of the inventive concept are not limited thereto. For example, exemplary embodiments may be implemented for devices other than the SSD 120 embedded in the main board 100 such as, for example, an embedded multimedia card (eMMC), a moviNAND memory device, an iNand memory device, etc.

Figure 8:
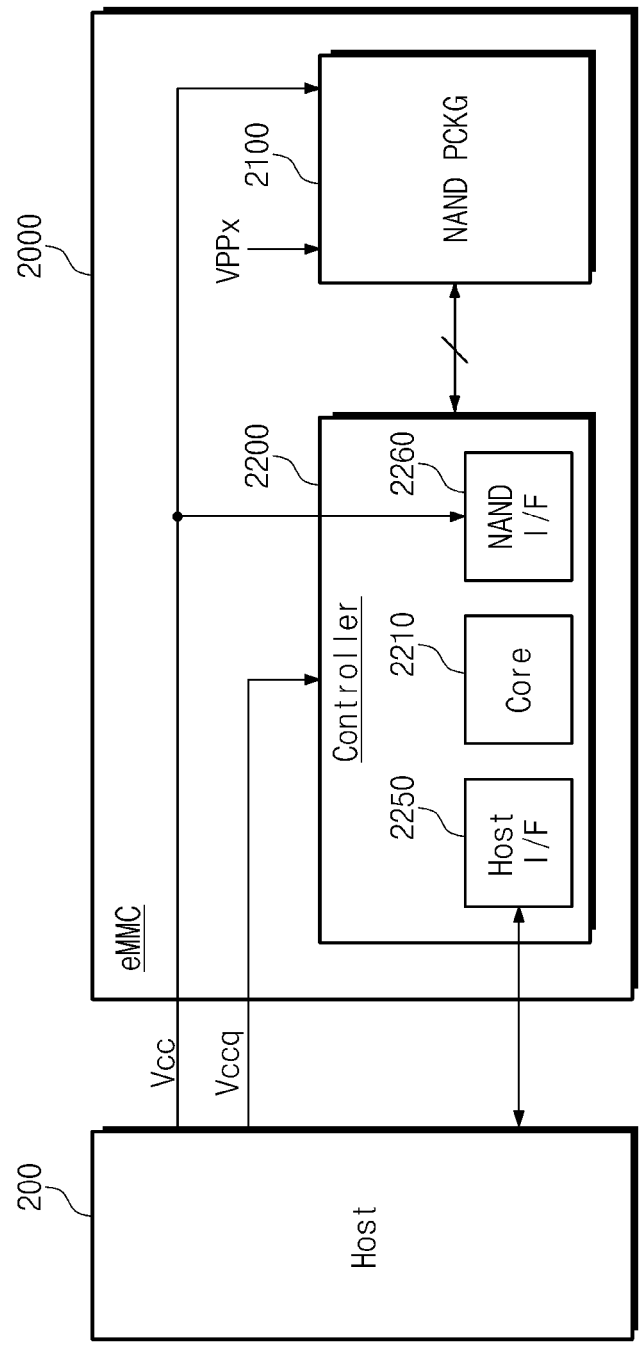
FIG. 8 is a block diagram illustrating an embedded multimedia card (eMMC) according to exemplary embodiments of the inventive concept.

FIG. 8 is a block diagram illustrating an eMMC according to an exemplary embodiment of the inventive concept. Referring to FIG. 8, an eMMC 2000 may include at least one NAND flash package 2100 and a memory controller 2200.

The NAND flash package 2100 may be embodied as a nonvolatile memory package NVM PCKG. The controller 2200 may be connected to the NAND flash package 2100 through at least one channel. The controller 2200 includes at least one controller core 2210, a host interface 2250, and a NAND interface 2260. The controller 2200 may include the self-diagnostic firmware described herein.

The controller core 2210 controls an overall operation of the eMMC 2000. The host interface 2250 establishes an interface between the controller 2210 and the host 200. The NAND interface 2260 establishes an interface between the NAND flash package 2100 and the controller 2200. In an exemplary embodiment, the host interface 2250 may be a parallel interface (e.g., an MMC interface). In an exemplary embodiment, the host interface 2250 may be a serial interface (e.g., a UHS-II, a UFS interface, etc.). In an exemplary embodiment, the host interface 2250 may be a NAND interface.

The eMMC 2000 may be provided with different power supply voltages (e.g., Vcc, Vccq) from the host 200. Herein, a first power supply voltage Vcc (e.g., about 3.3 V) is provided to the NAND flash device 2100 and the NAND interface 2260, and the second power supply voltage Vccq (e.g., about 1.8V or about 3.3V) is provided to the controller 2200. In an exemplary embodiment, the eMMC 2000 may be optionally provided with an external high voltage Vppx via the NAND flash package 2100.

According to exemplary embodiments, the eMMC 2000 may perform a test operation even in a package state through a self-diagnostic firmware, as described herein.

According to exemplary embodiments, a universal flash storage (UFS) may be utilized instead of an SSD.

Figure 9:
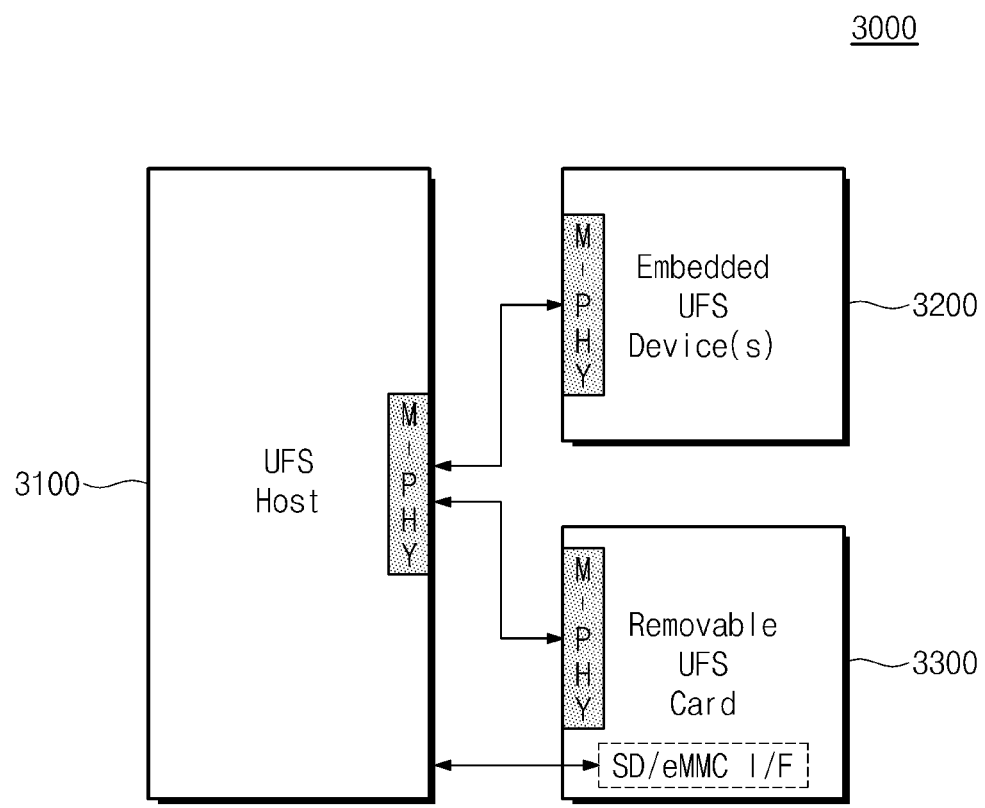
FIG. 9 is a block diagram illustrating a universal flash storage (UFS) system according to exemplary embodiments of the inventive concept.

FIG. 9 is a block diagram illustrating a UFS system according to exemplary embodiments of the inventive concept. Referring to FIG. 9, a UFS system 3000 may include a UFS host 3100, at least one embedded UFS device 3200 and a removable UFS card 3300. Communication between the UFS host 3100 and the embedded UFS device 3200, and between the UFS host 3100 and the removable UFS card 3300, may be performed through an M-PHY layer. Construction of the UFS host 3100 correspond to the main board 100 except the SSD 120 (see FIG. 1). At least one of the embedded UFS device 3200 and the removable UFS card 3300 may include a self-diagnostic firmware, as described with reference to FIGS. 1 through 6.

The UFS host 3100 may include a bridge so that the removable UFS card 3300 communicates by a different protocol from the UFS protocol. The UFS host 3100 may communicate with the removable UFS card 3300 using various card protocols such as, for example, UFDs, MMC, eMMC, SD, miniSD, microSD, etc.

Exemplary embodiments of the inventive concept are applicable to a mobile device.

Figure 10:
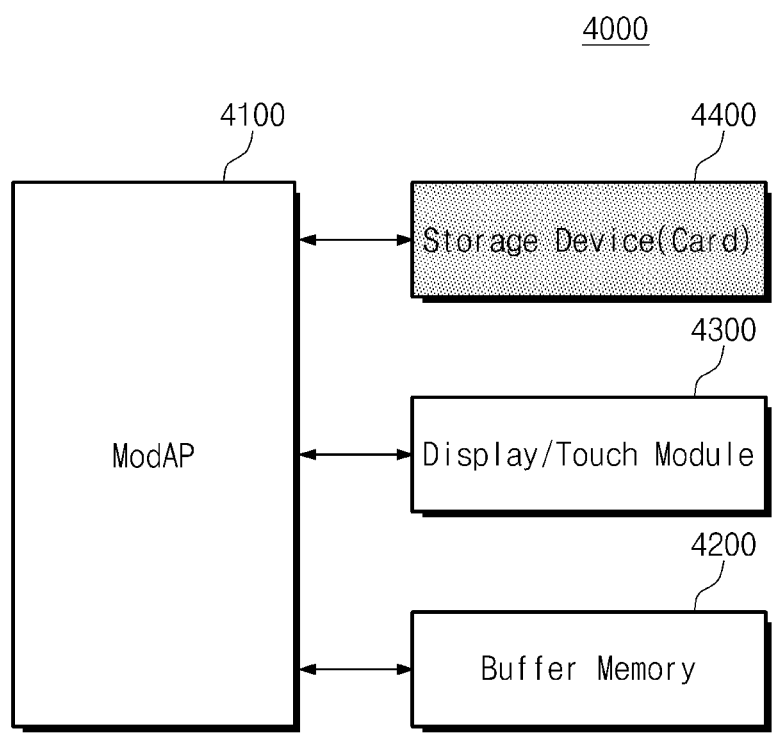
FIG. 10 is a block diagram illustrating a mobile device according to exemplary embodiments of the inventive concept.

FIG. 10 is a block diagram illustrating a mobile device according to exemplary embodiments of the inventive concept. Referring to FIG. 10, a mobile device 4000 includes an integrated processor (ModAP) 4100, a buffer memory 4200, a display/touch module 4300, and a storage device 4400.

The integrated processor 4100 may control an overall operation of the mobile device 4000, and may facilitate a wired/wireless communication with other devices. The buffer memory 4200 may temporarily store data needed in a processing operation of the mobile device 4000. The display/touch module 4300 may display data processed in the integrated processor 4100 or receive data from a touch panel. The storage device 4400 may store user data. The storage device 4400 may be, for example, an eMMC, an SSD, or a UFS device. The storage device 4400 may perform a self-diagnosis through a sideband interface as described with reference to FIGS. 1 through 6.

The mobile device 4000 can perform a test in the on-board state, and thereby may further improve reliability in a package state.

Figure 11:
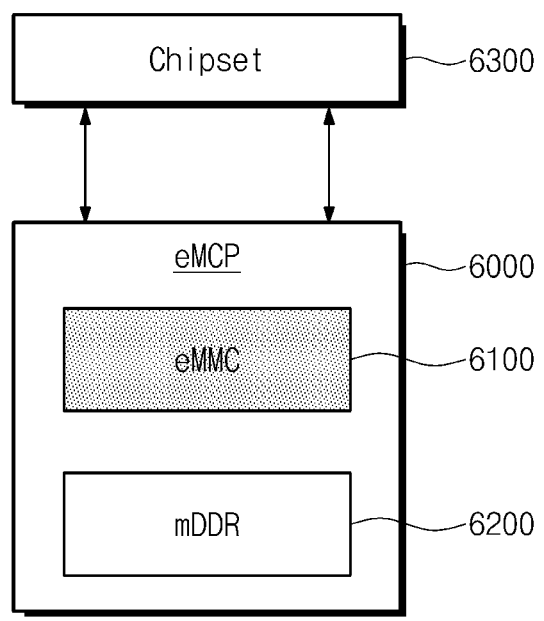
FIG. 11 is a block diagram of an embedded multi-chip package (eMCP) according to exemplary embodiments of the inventive concept.

FIG. 11 is a block diagram of an embedded multi-chip package (eMCP) according to exemplary embodiments of the inventive concept. Referring to FIG. 11, the eMCP 6000 includes an eMMC 6100 and a mobile double data rate (mDDR) memory device 6200 in one package. The eMMC 6100 may be embodied as the eMMC 200 illustrated in FIG. 8. The mDDR memory device 6200 may be, for example, a synchronous dynamic random access memory (SDRAM) flash memory device. The eMCP 6000 may communicate with a chipset 6300.

Figure 12:
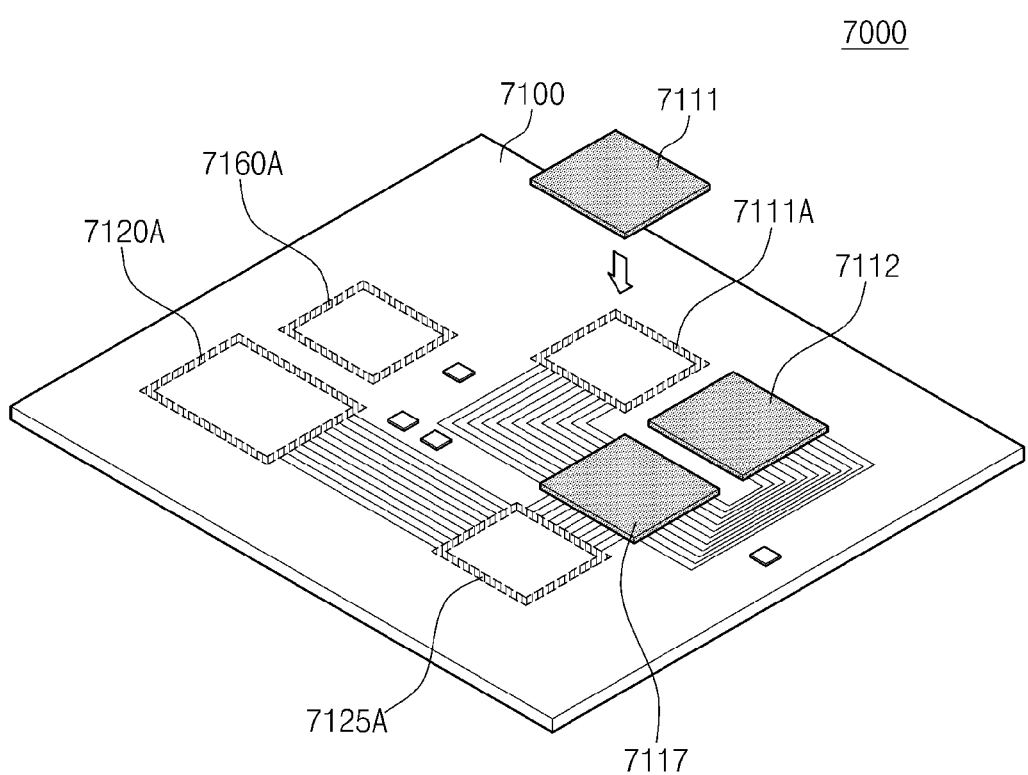
FIG. 12 is a drawing illustrating a main board including an on-board SSD according to exemplary embodiments of the inventive concept.

FIG. 12 is a drawing illustrating a main board including an on-board storage device according to an exemplary embodiment of the inventive concept. Referring to FIG. 12, in a main board 7000, various hardware components may be mounted on a printed circuit board (PCB) 7100. The main board 7000 may include a dedicated area 7120A in which a central processing unit (CPU) is mounted, a dedicated area 7160A in which a main memory (e.g., DRAM, PRAM, FlashDIMM) is mounted, a dedicated area 7125A in which a chipset is mounted, and a dedicated area 7111A in which a first memory package 7111 is mounted. The dedicated areas 7120A, 7160A, 7125A and 7111A may be electrically connected to one another through interconnections provided on the PCB 7100. A memory controller 7117 and a second memory package 7112 may be mounted in the dedicated areas included in the PCB 7100.

Each of the memory controller 7117 and the first and second memory packages 7111 and 7112 may be mounted on the printed circuit board (PCB) 7100 using, for example, a surface mounting technology (SMT). For example, the first memory package 7111 may be mounted in the mounting area 7111A of the PCB 7100. Each of the memory controller 7117 and the first and second memory packages 7111 and 7112 may be embodied as a separate chip or a separate package to be mounted on the PCB 7100.

In exemplary embodiments, other volatile/nonvolatile memory devices besides the first and second memory packages 7111 and 7112 may be further mounted. The memory controller 7117 and the first and second memory packages 7111 and 7112 may also be mounted on different surfaces of the PCB 7100. For example, the first memory package 7111 may be mounted on a first surface of the PCB 7100 and the second memory package 7112 may be mounted on a second surface opposite to the first surface.

After the memory controller 7117 and the first and second memory packages 7111 and 7112 are mounted on the PCB 7100, they are connected to an external device, and may perform a self-diagnosis operation under the control of the external device as described herein.

In the on-board storage device of FIG. 12, the memory controller 7117 and the first and second memory packages 7111 and 7112 are shown as being separated from one another. However, exemplary embodiments of the inventive concept are not limited thereto. For example, the memory controller 7117 and the first and second memory packages 7111 and 7112 may be included in one chip.

For example, in a case in which the memory controller 7117 and the first and second memory packages 7111 and 7112 are mounted on the PCB 7100 using a surface mounting technology (SMT), defects due to a contact failure or a high temperature of the memory controller 7117 and the first and second memory packages 7111 and 7112 may occur. The storage device according to exemplary embodiments of the inventive concept, after being mounted on the PCB 7100, may perform a self-diagnosis operation to detect the defects before other hardware elements are mounted on the PCB 7100.

As described above, a storage device according to exemplary embodiments of the inventive concept may perform a self-diagnostic test even after it is packaged in a main board by driving a self-diagnostic firmware through a sideband interface.

While the present inventive concept has been particularly shown and described with reference to the exemplary embodiments thereof, it will be understood by those of ordinary skill in the art that various changes in form and detail may be made therein without departing from the spirit and scope of the present inventive concept as defined by the following claims.

What is claimed is:

1. A storage device, comprising:
   at least one nonvolatile memory device; and
   a memory controller configured to control the at least one nonvolatile memory device, wherein the memory controller comprises:
   a host interface configured to communicate with a peripheral channel hub disposed external to the storage device;
   a sideband interface configured to receive a self-diagnostic command from a host disposed external to the storage device; and
   a self-diagnostic firmware configured to be driven in response to the self-diagnostic command, wherein the self-diagnostic command causes a self-diagnosis operation to be executed on the storage device.

2. The storage device of claim 1, wherein the host interface is a serial AT attachment bus express (SATAe) interface.

3. The storage device of claim 1, wherein the host interface is a peripheral component interconnect express (PCIe) interface.

4. The storage device of claim 1, wherein the sideband interface is an inter-integrated circuit (I2C) interface.

5. The storage device of claim 1, wherein the self-diagnostic firmware is stored in the at least one nonvolatile memory device.

6. The storage device of claim 1, wherein the self-diagnostic firmware comprises:
   a first mode supporting a start command for waking up the storage device,
   wherein the storage device is configured to accommodate commands needed by the self-diagnostic firmware to perform the self-diagnosis operation in response to the start command.

7. The storage device of claim 6, wherein the self-diagnostic firmware comprises:
   a second mode in which the storage device is in a maximum power state and in which a self-diagnostic session is closed.

8. The storage device of claim 7, wherein the self-diagnostic firmware comprises:
   a third mode in which the self-diagnostic session is authenticated and is in an open state.

9. The storage device of claim 1, wherein the sideband interface issues a write request, the self-diagnostic command is received from the host according to the write request, and the storage device sends an acknowledge signal to the host in response to the write request.

10. The storage device of claim 9, wherein the storage device receives a fetch command that instructs a self-diagnostic result value to be output after a predetermined time passes after the self-diagnostic command is received.

11. The storage device of claim 10, wherein a response signal comprising a busy retry packet is sent by the storage device to the host in response to the fetch command when performing the self-diagnosis operation.

12. The storage device of claim 10, wherein a response signal indicating that the self-diagnosis operation is completed is sent by the storage device to the host in response to the fetch command after the self-diagnosis operation is completed.

13. The storage device of claim 1, wherein an error internally generated by the storage device when performing the self-diagnosis operation is corrected by a predetermined process.

14. The storage device of claim 1, wherein the storage device is a peripheral component interconnect express (PCIe) solid state drive (SSD) further comprising a universal serial bus (USB) port connected to the host, wherein the sideband interface is provided via the USB port.

15. A method of self-diagnosing a storage device, comprising:
   receiving a self-diagnostic command through a sideband interface disposed in the storage device;

driving a self-diagnostic firmware in response to the self-diagnostic command, wherein the self-diagnostic firmware is disposed in the storage device and the self-diagnostic command causes a self-diagnosis operation to be executed on the storage device;

receiving a fetch command with respect to a driving result value of the self-diagnostic firmware through the sideband interface; and outputting the driving result value from the storage device to a debugger disposed external to the storage device through the sideband interface in response to the fetch command.

16. A main board, comprising:

a storage device comprising at least one nonvolatile memory device;

a peripheral channel hub configured to facilitate communication between a plurality of components disposed on the main board, wherein the peripheral channel hub is disposed external to the storage device;

a host interface disposed in the storage device and configured to communicate with the peripheral channel hub;

sideband interface disposed in the storage device and configured to receive a self-diagnostic command from a host disposed external to the main board; and a self-diagnostic firmware disposed in the storage device and configured to be driven in response to the self-diagnostic command, wherein the self-diagnostic command causes a self-diagnosis operation to be executed on the storage device.

17. The main board of claim 16, further comprising:

a multiplexer connected to the host, the peripheral channel huh, and the storage device, wherein the multiplexer is configured to receive the self-diagnostic command from the host and transmit the self-diagnostic command to the storage device.

18. The main board of claim 16, wherein the storage device is a solid state drive (SSD).

19. The main board of claim 16, wherein the plurality of components includes the storage device; a central processing unit (CPU) mounted on the main hoard, and a random access memory (RAM) mounted on the main hoard.

* * * * *